(12) United States Patent
Singh

(10) Patent No.: US 7,516,032 B2
(45) Date of Patent: Apr. 7, 2009

(54) RESOLUTION IN MEASURING THE PULSE WIDTH OF DIGITAL SIGNALS

(75) Inventor: Balwant Singh, Greater Noida (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 958 days.

(21) Appl. No.: 10/327,705

(22) Filed: Dec. 20, 2002

(65) Prior Publication Data

US 2003/0154043 A1  Aug. 14, 2003

(30) Foreign Application Priority Data

Dec. 20, 2001  (IN) .................. 1262/DEL/2001

(51) Int. Cl.
 *G06F 19/00* (2006.01)
 *G01R 29/02* (2006.01)
 *G01R 25/08* (2006.01)

(52) U.S. Cl. ............ 702/79; 368/89; 368/118; 368/120; 377/20; 702/179

(58) Field of Classification Search .......... 368/89, 368/118, 120; 377/20; 702/79, 176
See application file for complete search history.

(56) References Cited

U.S. PATENT DOCUMENTS

| | | | | |
|---|---|---|---|---|
| 2,738,461 A | * | 3/1956 | Burbeck et al. ........ | 368/119 |
| 2,831,162 A | * | 4/1958 | Gross .................... | 368/118 |
| 2,887,653 A | * | 5/1959 | Myers ................... | 368/118 |
| 2,888,647 A | * | 5/1959 | Beter et al. ............ | 341/166 |
| 3,264,454 A | * | 8/1966 | Davis et al. ............ | 377/20 |
| 3,541,448 A | * | 11/1970 | Nutt .................... | 368/118 |
| 4,468,746 A | * | 8/1984 | Davis ................... | 702/178 |
| 4,875,201 A | * | 10/1989 | Dalzell ................. | 368/120 |
| 5,382,899 A | * | 1/1995 | Funatsu et al. ........ | 324/207.18 |
| 5,818,797 A | * | 10/1998 | Watanabe et al. ...... | 368/113 |
| 6,246,737 B1 | * | 6/2001 | Kuglin ................. | 375/371 |
| 2003/0154043 A1 | * | 8/2003 | Singh .................. | 702/79 |

FOREIGN PATENT DOCUMENTS

| JP | 61-87418 A | * | 5/1986 |
|---|---|---|---|
| JP | 01-164118 A | * | 6/1989 |

* cited by examiner

*Primary Examiner*—Edward R Cosimano
(74) *Attorney, Agent, or Firm*—Lisa K. Jorgenson; Bryan A. Santarelli; Graybeal Jackson LLP

(57) ABSTRACT

A system and method for providing improved resolution in the measuring the pulse width of digital signals comprising counting the integral number of measuring clock pulses covered by said digital pulse and triggering a chain of cascaded high resolution delay elements from the trailing edge of said measuring clock pulses. Further, the invention measures the delay count obtained from said chain of cascaded delay elements from the trailing edge of the last measuring clock pulse up to the end of said digital pulse, and adds said measured delay count to said integral measuring clock pulse count to obtain the total width of said digital pulse.

25 Claims, 8 Drawing Sheets

RESOLUTION IN MEASURING THE PULSE WIDTH OF DIGITAL SIGNALS

PRIORITY CLAIM

This application claims priority from Indian patent application No. 1262/Del/2001, filed Dec. 20, 2001, which is incorporated herein by reference.

TECHNICAL FIELD

The present invention relates generally to a method and system for providing improved resolution in measuring the pulse width of digital signals. More particularly, this invention can be used for On-Chip Pulse measurement and Pulse-to-Digital conversion.

BACKGROUND

Pulse width measurements are often an essential requirement in characterizing digital circuits. With the advancements in technology, digital circuits are becoming increasingly faster and such measurements are becoming increasingly challenging. In particular, pulse-width measurements for high-speed digital circuits embedded in integrated circuits are extremely difficult and error-prone as the internal timings are significantly smaller than the signal delays from chip IO pads to external measuring instruments. The IO pads themselves contain buffering circuitry that adds considerable delay and that is incapable of operating at the high speeds of the internal circuitry. If Fmax is the maximum operating frequency of the IO, then only a pulse of width greater than or equal to 1/(2*Fmax.) can be measured by this method.

For this reason, pulse-width measurement circuits need to be integrated with the remaining circuitry of the device.

Existing designs of on-chip and off-chip pulse measurement circuitry utilize a high-speed clock as a timebase fed to a counter gated by the pulse width to be measured. Such designs are limited in resolution to the time period of the timebase clock.

SUMMARY

According to an embodiment of the invention, a method and system provide improved resolution in measuring the width of digital pulse signals, more particularly on-chip pulse characterization.

More specifically, a method according to an embodiment of the invention for providing improved resolution in the measuring of the pulse width of a digital signals, comprises the steps of:
  counting the integral number of measuring clock pulses covered by said digital pulse,
  triggering a chain of cascaded high-resolution delay elements from the trailing edge of said measuring clock pulses,
  measuring the delay count obtained from said chain of cascaded delay elements from the trailing edge of the last measuring clock pulse up to the end of said digital pulse, and
  adding said measured delay count to said integral measuring clock-pulse count to obtain the total width of said digital pulse.

The number of cascaded minimum delay elements is such that the cumulative delay of said chain of delay elements is slightly greater than the time period of the measuring clock.

The chain of cascaded minimum delay elements is triggered by both the leading and trailing edges of said measuring clock pulse so that the required number of delay elements is reduced to half.

The count value is converted to a compressed digital form.

The above method is applied to measurement of on-chip pulse widths thereby overcoming IO pad speed limitations of off-chip measurement techniques.

Also, a system according to an embodiment of the invention for providing improved resolution in measurement of pulse widths of a digital signal, comprises
  means for counting the integral number of measuring clock pulses covered by said digital pulse,
  means for triggering a chain of cascaded minimum delay elements from the trailing edge of said measuring clock pulses,
  means for measuring the delay count obtained from said chain of cascaded delay elements from the trailing edge of the last measuring clock pulse up to the end of said digital pulse, and
  means for adding said measured delay count to said integral measuring clock-pulse count to obtain the total width of said digital pulse.

The said delay elements are digital inverters.

The said measuring clock pulses are generated by any known oscillator.

The said count value is converted to a compressed digital form.

The number of said delay elements is such that the cumulative delay is slightly greater than the time period of the measuring clock.

The chain of cascaded minimum delay elements is triggered by both the leading and trailing edges of said measuring clock pulse so that the required number of delay elements is reduced to half.

The system is applied to on-chip pulse-width measurements thereby overcoming the IO pad speed limitations of off-chip measurement techniques.

BRIEF DESCRIPTION OF THE DRAWINGS

The invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
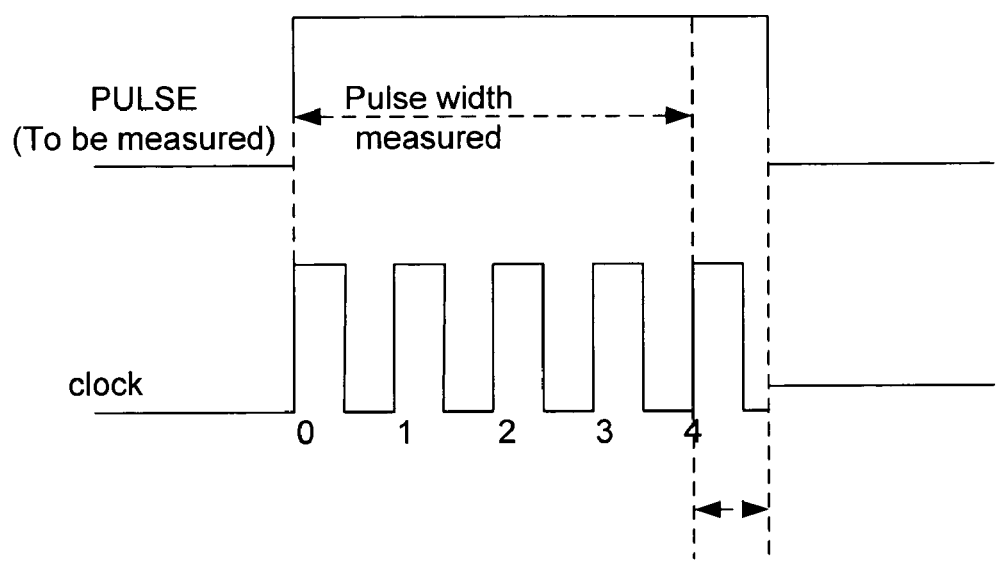
FIG. 1 shows the pulse-width measurement according to the prior art.

FIG. 1 shows the pulse-width measurement system of the prior art. Timebase signal 'clock' is counted for the duration of the pulse to be measured. The measurement resolution is the 'clock' period.

If the frequency of the high frequency clock is Fclk and Counter Count is N. Then the pulse width can be given as ~=(1/Fclk)*N. The value of the pulse width given above is inaccurate as the accuracy is ±(1/Fclk).

In the example shown, the system will measure the pulse width until count 4 because the pulse to be measured ends before the 5th clock pulse, hence that much is the error in the measurement, i.e., the time between the end of the pulse and the beginning of the 5th clock pulse.

Figure 2:
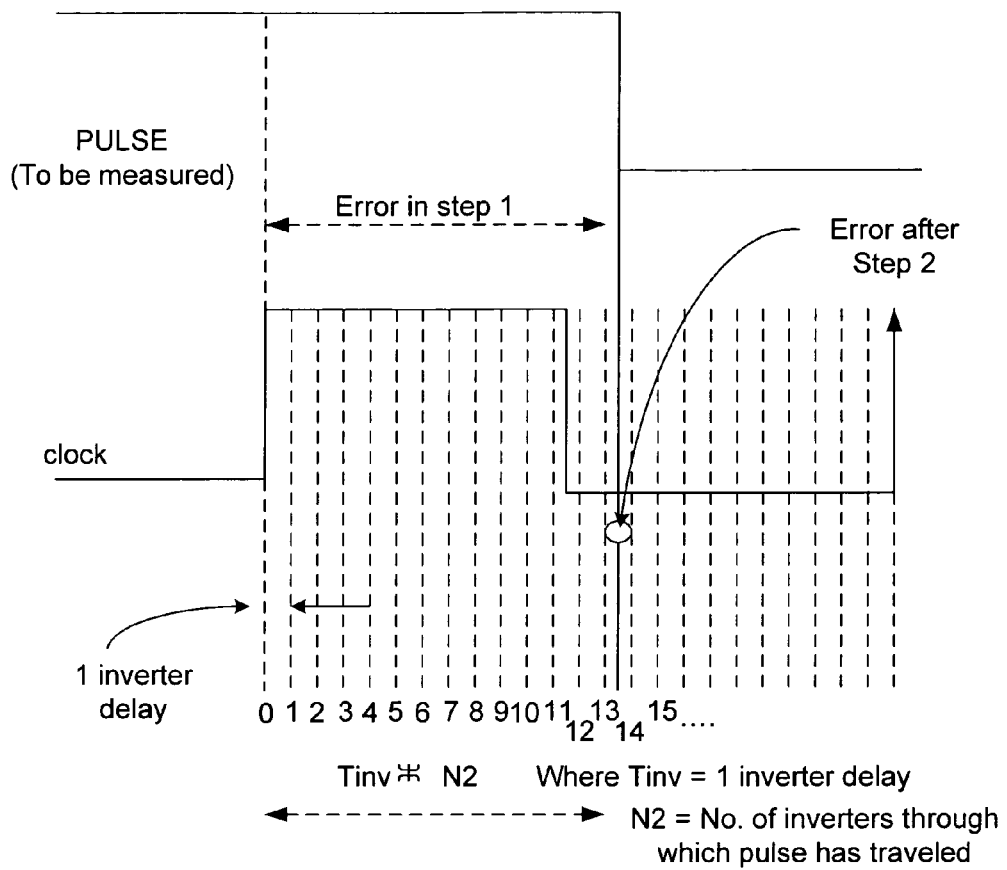
FIG. 2 shows a pulse-width measurement according to an embodiment of the invention.

FIG. 2 shows the improvement introduced by an embodiment of this invention. The system calculates the time for which the input PULSE has travelled before the next clock. This is done by using a cascaded inverter chain, which is typically the smallest delay element that can be used.

The error introduced in measuring the PULSE width is reduced to 1 inverter delay after this step. After doing the calculation in two steps the pulse width can be mathematically represented as $$\text{Pulse width} = (1/Fclk)*N1 + Tinv*N2$$

Where Eclk=Counter clock frequency
N1=CounterCount
Tinv=1 inverter delay
N2=No. of inverters through which pulse has travelled To meet the measurement requirement, the Inverter chain length should be greater than the Fclk (counter clock) clock period. i.e.

$$\text{No. of Inverters Needed} = [(1/Fclk)+t]/Tinv$$

Where Fclk: Operating frequency
Tinv=delay of inverter used
t.=Margin kept in the system after spice simulations and Clock jitter analyses, to ensure that the pulse to be measured do not cross the chain else this can result in error of ~1 clock period.

To trace the point which the Pulse has reached in the inverter chain, at the output of all the inverters, a latch is connected which can be controlled by the Pulse. Pulse rising enables all the latches for transparent mode and falling puts them in latch mode.

Figure 3:
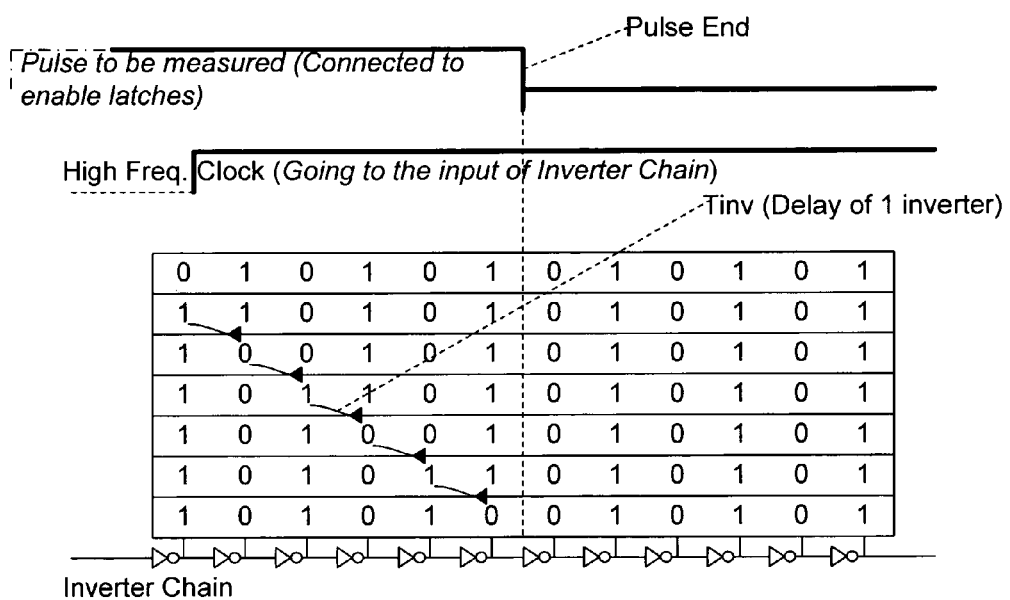
FIG. 3 shows a data flow in the inverter chain according to an embodiment of the invention.

FIG. 3 shows the data flow in the inverter chain according to an embodiment of the invention. Clock edge (rising edge in FIG. 3) travelling in the chain is transparent at the output of the latches while the pulse is high. At the point the pulse goes low, all the latches enter into latch mode at this moment in the chain at the point at which the rising edge of clock has travelled we get a inverted outputs between 2 consecutive latches output. The falling of the pulse enable makes the clock pulse not latched in the latch just after the inverter which the clock has reached (due to propagation delay of inverter). This effect makes a repetition ( . . . 0110 . . . or . . . 1001 . . . ) in the chain. Number of such repetition shows no. of edges travelling in the chain. Hence the delay time can be given as Tinv * N (where N=No. of inverter at which we get repetition effect, Tinv is the propagation delay of one inverter.

The chip area required for implementing Step 2 is directly proportional to (1/Fclk), hence the above-mentioned methodology can be modified to reduce the area by reducing the chain length and "t" (margin) to half, which means that area is reduced by 2. This is possible with sampling done on both the clock edges (rising and falling).

Figure 4:
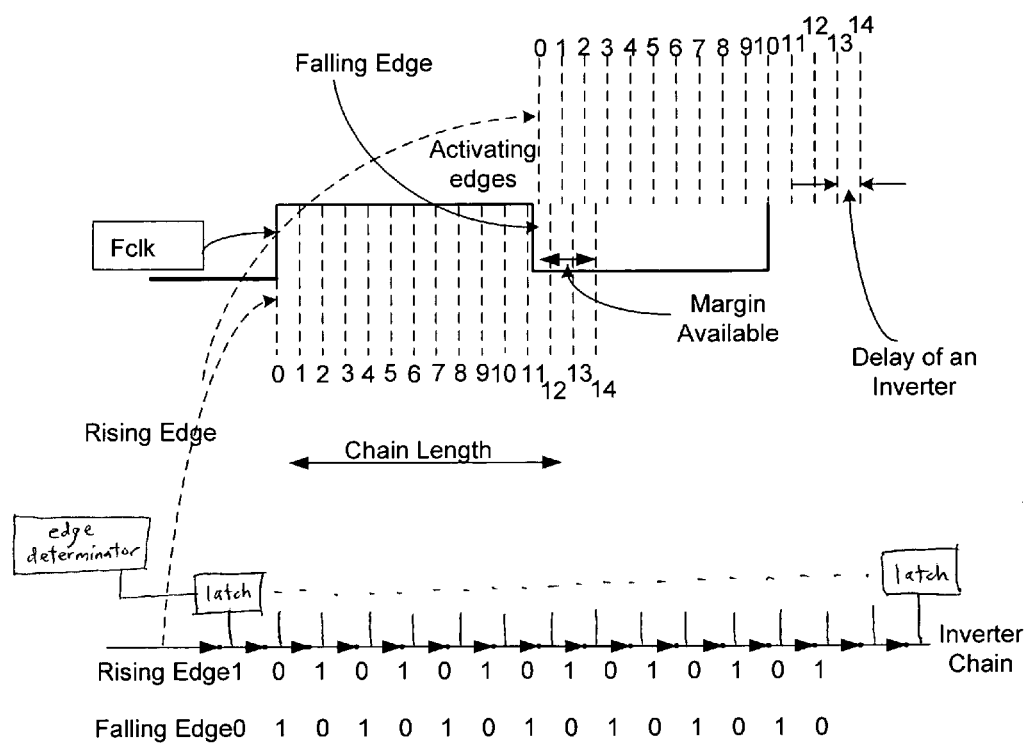
FIG. 4 shows a method to reduce the chain length according to an embodiment of the invention.

FIG. 4 shows the pulse measurement using both clock edges. It is assumed that the counter increments at every rising edge of the Fclk. A latch is coupled to the output of each inverter in the inverter chain, and an edge determinator is coupled to the latch coupled to the first inverter.

The chain length is={[(1/Fclk)/2]+Margin} The input of the first inverter in the chain can be latched and can be used to check the position of Fclk at the time the pulse goes low. This makes the calculations as below.

$$Tsec = K + Tinv*N$$

Where K=0 if the output of the latch at the starting of the chain is '1'.

This shows that Fclk was high when the pulse went low.
K=[(1/Fclk)/2]if the output of the starting latch is '0'.
This shows that the Fclk was low and hence we need to add the half period in the calculation
Tinv=Propagation delay of single inverter
N=No. of inverter at which we see the repetition effect.

Figure 5:
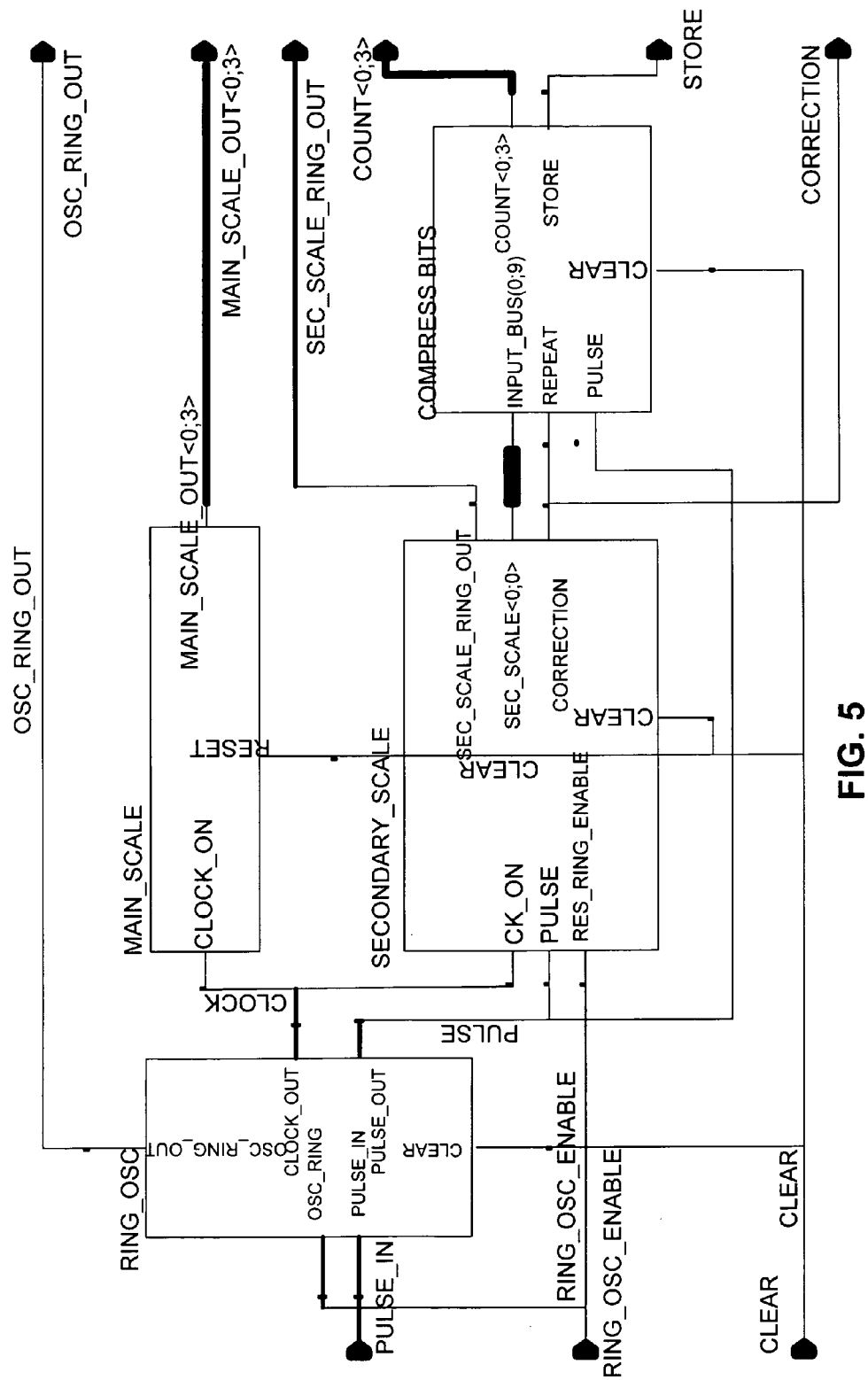
FIG. 5 is a block diagram of an embodiment of the invention.

FIG. 5 shows a preferred embodiment of the invention using blocks:
RING_OSC
MAIN_SCALE
SECONDARY_SCALE
COMPRESS_BITS The RING_OSC block is a ring oscillator, which is enabled by the input pulse to be measured. The main feature of this ring oscillator is that it maintains the final stage (0,1) when the pulse at input (which is to be measured) goes low. This feature of the RING_OSC removes the inaccuracy of one clock period of output oscillation which will be in case of normal ring oscillator.

The MAIN_SCALE block is a simple counter, to perform step 1 calculations. This block counts the number of clock pulses delivered by the RING_OSC block.

The SECONDARY_SCALE block is used to trace the distance that the Pulse has travelled in Clock from RING_OSC i.e.; for the Step 2 Calculation. This block includes a chain of inverters through which the clock from RING_OSC propagates and the values at the output of the inverters are latched. The final inverter chain value is latched by the falling edge of the PULSE to be measured. The chain of inverters can be switched in oscillate mode to get the delay of one inverter. So, the accuracy is still +− one inverter delay.

The COMPRESS_BITS block reduces the number of bits from the SECONDARY_SCALE. This is done by comparing the bits in a normal inverter chain and the inverter chain output latched by SECONDARY_SCALE. In normal inverter chain the pattern of . . . 01010 . . . will be repeated for the no. of inverters in the chain but in the secondary scale latched value there will be repetition of 00 or 11 in the full chain somewhere ( . . . 0110101 . . . or . . . 010010 . . . ) 0=the repetition of bits shows that the clock edge has travelled to that inverter. For a secondary scale output of 64 bits (that means 64 inverters are used in the secondary scale) the compress bit will convert it to 6 bit which will be the number of the inverter that the clock edge has reached.

Figure 6:
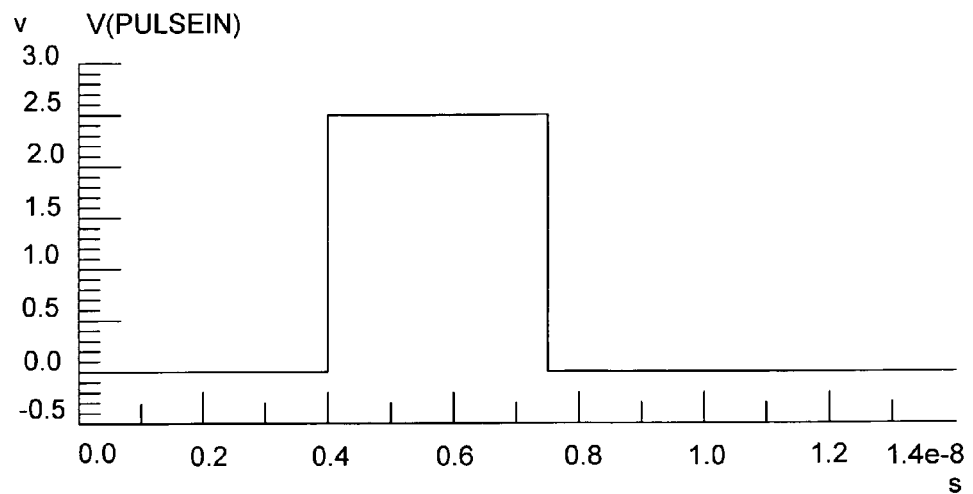
FIG. 6 shows simulation results of the RING Oscillator according to an embodiment of the invention.
Figure 6:
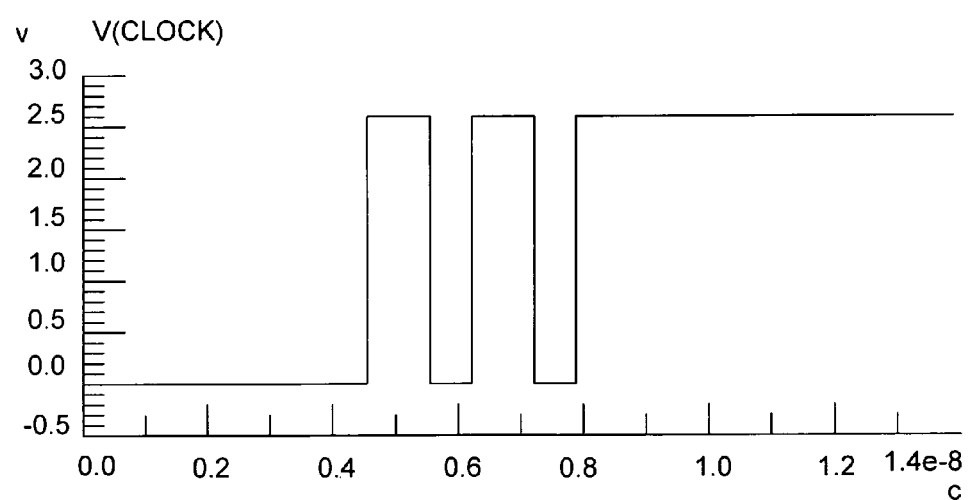
Figure 7:
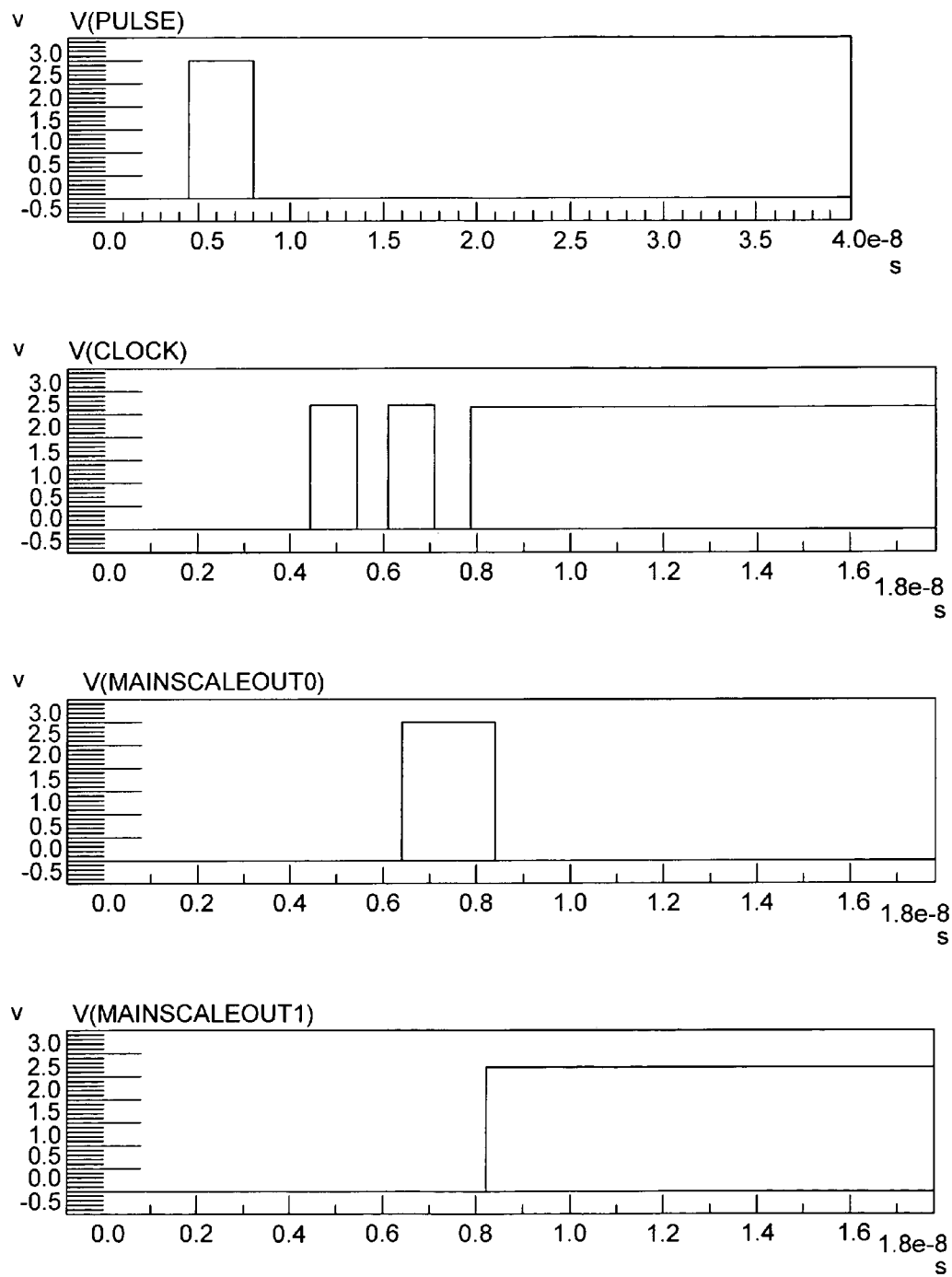
FIG. 7 shows simulation results of main scale counter according to an embodiment of the invention.
Figure 8:
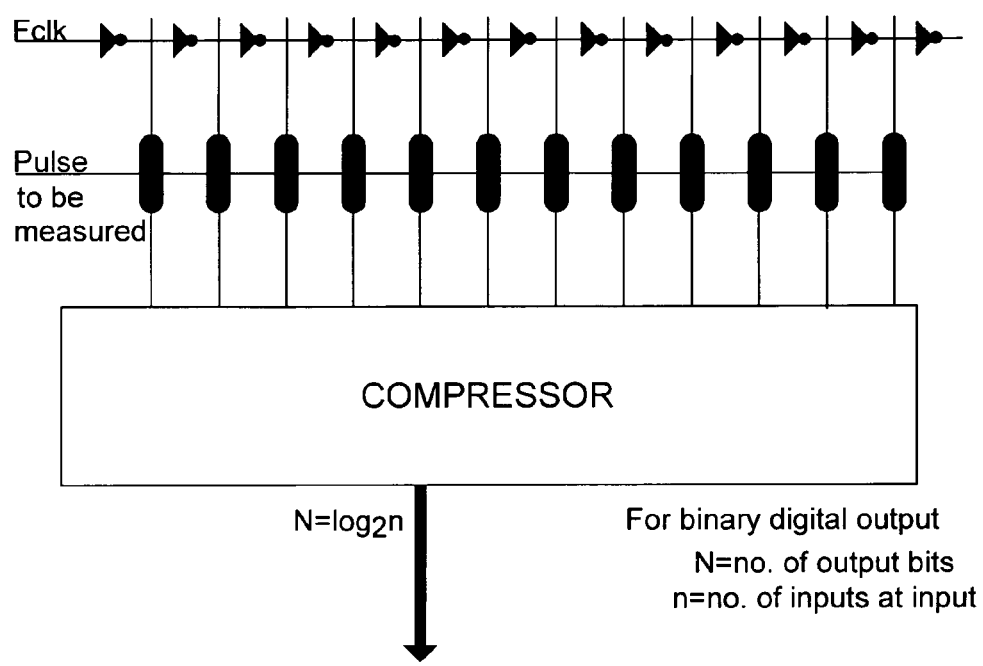
FIG. 8 is a secondary scale block diagram according to an embodiment of the invention.

FIGS. 6, 7 and 8 show signals obtained at each block of the preferred embodiment of FIG. 5, using a simulation of the system according to an embodiment of the invention.

Some Advantages of Embodiments of the Invention

On-chip pulse width characterization is possible, which removes the tester inaccuracy during characterization of pulse width.

Accuracy is increased. The inaccuracy inserted is ± of 1 inverter delay (which is few tens of picoseconds ps).

The pulse width available is in the form of digital data (binary, grey etc. depending on the Compress_BITS logic).

The pulses of width less the 1/(2*Fmax) (where Fmax is the maximum operating frequency of the output pad) can also be measured now.

No repeater is needed to transfer the data from block to block/IO Pads, as data is static and in digital format.

Measurement range can be increased with minimum increase of hardware. For example to double the range only addition of single Flip-Flop is needed in the step 1 counter.

It will be apparent to those with ordinary skill in the art that the foregoing is merely illustrative, and not intended to be exhaustive or limiting, having been presented by way of example only and that various modifications can be made within the scope of the invention. Accordingly, this invention is not to be considered limited to the specific examples chosen for purposes of disclosure, but rather to cover all changes and modifications within the spirit and scope of the present invention.

What is claimed is:

1. A method for providing improved resolution in measuring the pulse width of digital signals, comprising the steps of:
   counting the integral number of measuring clock pulses covered by said digital pulse,
   triggering a chain of serially coupled inverters coupled to the measuring clock, operable to receive the pulse, and operable to measure a portion of the duration of the pulse, a first one of the inverters operable to transition an output signal in response to an edge of the clock signal, and one or more subsequent inverters each operable to transition a respective output signal in response to a transition of an output signal from a previous one of the inverters, each of the first and subsequent inverters having a respective delay, the sum of the delays being greater than one half of the time period of the clock signal and less than the time period of the clock signal;
   determining a delay count based on the number inverters that have been triggered;
   measuring the delay count obtained from said chain of inverters from the leading or trailing edge of the last measuring clock pulse up to the end of said digital pulse, and
   adding said measured delay count to said integral measuring clock pulse count to obtain the total width of said digital pulse.

2. A method as claimed in claim 1 wherein the count value is converted to a compressed digital form.

3. A method as claimed in claim 1 applied to measurement of on chip pulse widths thereby overcoming IO pad speed limitations of off-chip measurement techniques.

4. A system for providing improved resolution in measuring the pulse width of digital signals, comprising
   means for counting the integral number of measuring clock pulses covered by said digital pulse,
   means for triggering a chain of serially coupled inverters coupled to the measuring clock, operable to receive the pulse, and operable to measure a portion of the duration of the pulse, a first one of the inverters operable to transition an output signal in response to an edge of the clock signal, and one or more subsequent inverters each operable to transition a respective output signal in response to a transition of an output signal from a previous one of the inverters, each of the first and subsequent inverters having a respective delay, the sum of the delays being greater than one half of the time period of the clock signal and less than the time period of the clock signal;
   means for measuring the delay count obtained from said chain of inverters from the leading or trailing edge of the last measuring clock pulse up to the end of said digital pulse, and
   means for adding said measured delay count to said integral measuring clock pulse count to obtain the total width of said digital pulse.

5. A system as claimed in claim 4 wherein said measuring clock pulses are generated by any known oscillator.

6. A system as claimed in claim 4 wherein said count value is connected to a compressed digital form.

7. A system as claimed in claim 4 applied to on-chip pulse width measurements thereby overcoming the IO pad speed limitations of off-chip measurement techniques.

8. A circuit for measuring a duration of a pulse, the circuit comprising:
   a clock generator operable to generate a clock signal;
   a counter coupled to the clock generator and operable to receive the pulse and to count full periods of the clock signal for measuring a portion of the duration of the pulse; and
   a chain of serially coupled inverters coupled to the clock generator, operable to receive the pulse, and operable to measure a remaining portion of the duration of the pulse, a first one of the inverters operable to transition an output signal in response to an edge of the clock signal, and one or more subsequent inverters each operable to transition a respective output signal in response to a transition of an output signal from a previous one of the inverters, each of the first and subsequent inverters having a respective delay, the sum of the delays being greater than one half of the time period of the clock signal and less than the time period of the clock signal.

9. The circuit of claim 8 wherein the inverter chain comprises:
   a first of the inverters operable to receive the clock signal; and
   latches each having an input node coupled to a respective one of the inverters and each having a control node operable to receive the pulse.

10. The circuit of claim 8, further comprising a compressor coupled to the inverter chain and operable to generate a digital value that represents the measured partial period.

11. The circuit of claim 8, further comprising an edge determinator coupled to the clock generator and to the inverter chain and operable to identify the direction of a current edge of the clock signal.

12. A method, comprising:
   measuring a width of a pulse with a first resolution;
   measuring the width of the pulse with a second resolution using a delay chain having a total delay greater than one half of the first resolution and less than the first resolution; and
   calculating the width of the pulse by combining the first and second resolution measurements.

13. The method of claim 12 wherein measuring the pulse width with a first resolution comprises counting an integer number of contiguous time periods that occur during the pulse.

14. The method of claim 12 wherein measuring the pulse width with a second resolution comprises counting an integer number of contiguous first time periods that occur during a second time period within the pulse, each first time period being shorter than the second time period.

15. The method of claim 12 wherein:
measuring the pulse width with a first resolution comprises counting an integer number of clock periods that occur during the pulse; and
measuring the pulse width with a second resolution comprises measuring a number of subperiods that occur during a current clock period.

16. The method of claim 12 wherein:
measuring the pulse width with a first resolution comprises counting an integer number of clock edges that occur during the pulse; and
measuring the pulse width with a second resolution comprises measuring a number of delay elements through which a current clock edge propagates.

17. A method for measuring a width of a pulse, the method comprising:
generating in response to the pulse a clock signal having a period and clock edges;
counting an integer number of clock periods that occur during the pulse;
determining an integer number of inverters through which a current clock edge propagates, the inverters arranged in a delay chain having a total delay greater than one half of the clock period and less than the clock period; and
calculating the width of the pulse by summing a first time period represented by the counted number of clock periods and a second time period represented by the determined number of inverters.

18. The method of claim 17 wherein generating the clock signal comprises generating an initial edge of the clock signal in response to an initial edge of the pulse.

19. The method of claim 17 wherein counting the integer number of clock periods comprises counting every clock edge that occurs during the pulse.

20. The method of claim 17 wherein determining the integer number of inverters comprises latching the output signals from the inverters in response to an ending edge of the pulse.

21. The method of claim 17 wherein determining the integer number of inverters comprises:
latching the output signals from the inverters in response to an ending edge of the pulse; and
counting from the first inverter to and including an inverter having an output signal that is the same as the output signal of an immediately subsequent inverter.

22. The method of claim 17 wherein
generating a clock signal comprises generating a first edge of the clock signal in response to the pulse, the first edge of the clock signal having a first direction; and
determining the integer number of inverters comprises determining an integer number of inverters through which a current clock edge having the first direction propagates by,
latching the output signals from the inverters in response to an ending edge of the pulse, and
counting from the first inverter to and including an inverter having an output signal that is the same as the output signal of an immediately subsequent inverter.

23. The method of claim 17 wherein
generating a clock signal comprises generating a first edge of the clock signal in response to the pulse, the first edge of the clock signal having a first direction;
determining the integer number of inverters comprises determining an integer number of inverters through which a current clock edge having the first direction or a second direction propagates by,
latching the output signals from the inverters in response to an ending edge of the pulse, and
counting from the first inverter to and including an inverter having an output signal that is the same as the output signal of an immediately subsequent inverter; and
calculating the width of the pulse comprises adding one half clock period to the second time period if the current clock edge has the second direction.

24. The method of claim 17 wherein
generating a clock signal comprises generating a first rising edge of the clock signal in response to an initial edge of the pulse; and
determining the integer number of inverters comprises determining an integer number of inverters through which a current rising clock edge propagates by,
latching the output signals from the inverters in response to an ending edge of the pulse, and
counting from the first inverter to and including an inverter having an output signal that is the same as the output signal of an immediately subsequent inverter.

25. The method of claim 17 wherein
generating a clock signal comprises generating a first rising edge of the clock signal in response to an initial edge of the pulse;
determining the integer number of inverters comprises determining an integer number of inverters through which a current clock edge propagates by,
latching the output signals from the inverters in response to an ending edge of the pulse, and
counting from the first inverter to and including an inverter having an output signal that is the same as the output signal of an immediately subsequent inverter; and
calculating the width of the pulse comprises adding one half clock period to the second time period if the current clock edge is a falling edge.

\* \* \* \* \*